(12) United States Patent
Seo et al.

(10) Patent No.: US 6,642,107 B2
(45) Date of Patent: Nov. 4, 2003

(54) NON-VOLATILE MEMORY DEVICE HAVING SELF-ALIGNED GATE STRUCTURE AND METHOD OF MANUFACTURING SAME

(75) Inventors: Kang-ill Seo, Seoul (KR); Jae-seung Hwang, Suwon (KR); Seung-min Lee, Sungnam (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/191,119

(22) Filed: Jul. 9, 2002

(65) Prior Publication Data

US 2003/0032241 A1 Feb. 13, 2003

(30) Foreign Application Priority Data

Aug. 11, 2001 (KR) ........................................ 2001-48526

(51) Int. Cl.$^7$ ............................................. H01L 21/336
(52) U.S. Cl. ........................................ 438/257; 438/263
(58) Field of Search .................................. 438/221, 222, 438/257, 259, 262, 263, 264, 270, 280

(56) References Cited

U.S. PATENT DOCUMENTS 6,153,467 A * 11/2000 Wu

* cited by examiner

Primary Examiner—Phuc T. Dang
(74) Attorney, Agent, or Firm—Mills & Onello LLP

(57) ABSTRACT

A method for manufacturing a non-volatile memory device including a self-aligned gate structure, and a non-volatile memory device manufactured by the same method, are provided. In the method for manufacturing a non-volatile memory device, a tunnel dielectric layer is formed on a semiconductor substrate. First floating gate patterns are formed on the tunnel dielectric layer. Mold patterns are formed on the first floating gate patterns to selectively expose predetermined portions of the first floating gate patterns. Floating gates are formed by removing the exposed portions of the first floating gate patterns using the mold patterns as a mask. Interlayer dielectric layer patterns are formed for insulating the floating gates from one another by filling gaps between the mold patterns. The mold patterns exposed between the interlayer dielectric layer patterns are formed using the interlayer dielectric layer patterns as an etching mask. A dielectric layer is formed on the floating gates exposed by the removal of the mold patterns, between the interlayer dielectric layer patterns. Control gates are formed, aligned with the floating gates, by filling gaps between the interlayer dielectric layer patterns on the dielectric layer.

39 Claims, 11 Drawing Sheets

NON-VOLATILE MEMORY DEVICE HAVING SELF-ALIGNED GATE STRUCTURE AND METHOD OF MANUFACTURING SAME

BACKGROUND OF THE INVENTION

1. Field of the Invention

The present invention relates to a memory device, and more particularly, to a method for manufacturing a non-volatile memory device having a self-aligned gate structure and a non-volatile memory device formed by the same method.

2. Description of the Related Art

Data programming, which is an operation of a non-volatile memory device, is carried out by applying a voltage coupled at a floating gate with a positive voltage applied to a control gate, directing electrons ejected from a substrate to a floating gate through a tunnel dielectric layer (or a tunnel oxide layer) by F-N tunneling or hot carrier injection, and capturing the electrons in the floating gate. Data erase, which is another operation of a non-volatile memory device, is carried out by directing the electrons in the floating gate back to the substrate through F-N tunneling with a negative voltage applied to the control gate.

The operational speed and performance of such a non-volatile memory device is strongly dependent on the ratio of the voltage coupled at the floating gate to the voltage applied to the control gate. As the coupling ratio increases, the operational speed and performance of the non-volatile memory device are improved. The coupling ratio actually represents the ratio of the voltage coupled at the floating gate to the voltage applied through a wordline to the control gate. The coupling ratio may be varied in accordance with various factors. In a case where the electric charge of the floating gate is initialized to 0 by application of ultraviolet rays and parasitic capacitance is supposed to be 0, the coupling ratio $V_{fg}/N_{cg}$ can be represented by the ratio of the capacitance generated at an oxide/nitride/oxide (ONO) layer, which can be used as a dielectric layer between gate layers, to the sum of the capacitance generated at the oxide/nitride/oxide (ONO) layer and the capacitance generated at a tunnel oxide layer ($C_{ONO}/(C_{ONO}+C_{tunnel\ oxide})$).

Accordingly, in order to increase the coupling ratio, the $C_{ONO}/C_{ONO}+C_{tunnel\ oxide}$ ratio must be increased. Various methods for increasing the $C_{ONO}/C_{ONO}+C_{tunnel\ oxide}$ ratio including a method for increasing $C_{ONO}$ have been proposed. Specifically, in order to increase the area of an ONO layer that is used as a dielectric layer between gate layers, the height of the floating gate can be increased. For example, the thickness of the floating gate in a 0.35 μm-level NAND type product is about 1000 Å. On the other hand, it is suggested that the thickness of the floating gate in a 0.19 μm-level NAND type product is about 2000 Å.

That is, in order to maintain a predetermined coupling ratio, it is important to maintain at least a predetermined contact area between the dielectric layer between gate layers and the floating gate. However, since the pitch of memory devices continues to decrease, the height of the floating gate must be increased to maintain the predetermined contact area between the dielectric layer and the floating gate.

The increase in the height of the floating gate causes various problems in a self-aligned gate etching process. The increase in the height of the floating gate means an increase in the aspect ratio of the whole gate structure. As the aspect ratio of the gate structure increases, it becomes more difficult to control the critical dimension (CD), and profile defects, such as undercuts caused by an electron shading effect that may occur at a high aspect ratio, occur more frequently.

FIG. 1 is a diagram illustrating an undercut generation model in a self-aligned gate etching process of a non-volatile memory device. Referring to FIG. 1, a gate structure includes a tunnel dielectric layer 21 formed in an active region on a semiconductor substrate 10, a floating gate 30 formed on the tunnel dielectric layer 21, an interlayer dielectric layer 25 formed on the floating gate 30, a control gate 40 formed on the interlayer dielectric layer 25, and a hard mask 50 formed on the control gate 40. The floating gate 30 may be formed of conductive polysilicon, and the control gate 40 may be formed of a double layer consisting of a conductive polysilicon layer 41 and a tungsten silicide ($WSi_x$) layer 45. The hard mask 50 is used as an etching mask in the gate etching process.

The etching process for forming the gate structure is performed using the hard mask 50 as an etching mask on the tungsten silicide layer 45, the polysilicon layer 41, the interlayer dielectric layer 25 that is an ONO layer, and the polysilicon layer of the floating gate 30. That is, the etching process is self-aligned. However, during the etching process, electrons may accumulate on upper layers, i.e., the control gate 40 and the hard mask 50. Accordingly, the trajectory of the ions which etch the underlying layers may be varied by the electrons accumulated on the control gate 40 and the hard mask 50, and the sidewalls of the floating gate 30 may be etched, thereby generating undercuts. The generation of undercuts in an etching process may cause the profile of the gate structure to deteriorate.

The increase in the aspect ratio of the gate structure caused by the increase in the thickness of the floating gate may cause profile defects and may cause the height of an interlayer dielectric (ILD) layer to increase.

FIG. 2 is a cross-sectional view illustrating an interlayer dielectric layer covering a gate structure of a non-volatile memory device. Referring to FIG. 2, after forming a gate structure using such a self-aligned gate etching method, an interlayer dielectric layer 60 is formed to cover the gate structure. Before the deposition of the interlayer dielectric layer 60, the tunnel dielectric layer 21 may be cured. As a result of curing, the exposed sidewalls of the floating gate 30 and the control gate 40 are oxidized, thereby forming a gate sidewall oxide layer 23.

Since the interlayer dielectric layer 60 is formed to cover the gate structure, the height of the interlayer dielectric layer 60 increases in accordance with the increase in the thickness of the floating gate 30. The increase in the height of the interlayer dielectric layer 60 may cause a contact hole, formed in a subsequent process, not to open. For example, when forming a contact 70 for a common source line, a contact hole 75 used to form the contact 70 may not open. Accordingly, to prevent this problem, the height of the interlayer dielectric layer 60 must be reduced. However, in the case of employing a conventional self-aligned gate etching method, it is difficult to decrease the height of the interlayer dielectric layer 60.

SUMMARY OF THE INVENTION

To solve the above-described problems, it is a first object of the present invention to provide a method for manufacturing a non-volatile memory device having a self-aligned gate structure which is capable of improving the profile of the gate structure.

It is a second object of the present invention to provide a method for manufacturing a non-volatile memory device having a self-aligned gate structure which is capable of preventing a defect of unopened contact holes from occurring in a process for forming a contact, by decreasing the height of an interlayer insulating layer for insulating the gate structure.

In accordance with the invention, there is provided a method for manufacturing a non-volatile memory device capable of forming the control gate by an improved damascene process to be naturally self-aligned with the floating gate. This method includes forming a tunnel dielectric layer on a semiconductor substrate, forming first floating gate patterns on the tunnel dielectric layer, forming mold patterns on the first floating gate patterns to selectively expose predetermined portions of the first floating gate patterns, forming floating gates by removing the exposed portions of the first floating gate patterns using the mold patterns as a mask, forming interlayer dielectric layer patterns for insulating the floating gates from one another by filling gaps between the mold patterns, removing the mold patterns exposed between the interlayer dielectric layer patterns using the interlayer dielectric layer patterns as an etching mask, forming a dielectric layer on the floating gates exposed by the removal of the mold patterns between the interlayer dielectric layer patterns, and forming control gates aligned with the floating gates by filling gaps between the interlayer dielectric layer patterns on the dielectric layer.

In one embodiment, the mold patterns are formed of a material having an etching selectivity with respect to the floating gates. The mold patterns are formed of a material having an etching selectivity with respect to the interlayer dielectric layer patterns. Also, the mold patterns are formed of a material having an etching selectivity with respect to the semiconductor substrate.

Further, the mold patterns may be formed of silicon nitride ($Si_3N_4$), silicon oxynitride (SiON), silicon oxyfluoride (SiOF), boron nitride (BN), hydrosilsesquioxane (HSQ), xerogel, aerogel, parlene, polynaphtalene, amorphous-carbon fluoride (a-CF), silicon oxycarbide (SiOC), methylsilses quioxane (MSQ), black diamond, flare, polyimide, or Teflon.

The interlayer dielectric layer patterns are formed of silicon oxide ($SiO_2$), silicon nitride ($Si_3N_4$), silicon oxynitride (SiON), silicon oxyfluoride (SiOF), boron nitride (BN), hydrosilsesquioxane (HSQ), xerogel, aerogel, parlene, polynaphtalene, amorphous-carbon fluoride (a-CF), silicon oxycarbide (SiOC), methylsilses quioxane (MSQ), black diamond, flare, polyimide, or Teflon. However, preferably, the interlayer dielectric layer patterns are formed of a different material from that of the mold patterns.

In accordance with another aspect of the invention, there is also provided a method for manufacturing a non-volatile memory device including: forming field regions extending in one direction on a semiconductor substrate, to define active regions; forming a tunnel dielectric layer on the active regions; forming first floating gate patterns covering the tunnel dielectric layer and extending in the direction of the length of the field regions; forming mold patterns on the first floating gate patterns, crossing the first floating gate patterns and selectively exposing predetermined portions of the first floating gate patterns; forming floating gates by removing the exposed portions of the first floating gate patterns using the mold patterns as a mask; forming interlayer dielectric layer patterns for insulating the floating gates from one another by filling gaps between the mold patterns; removing the mold patterns exposed between the interlayer dielectric layer patterns, using the interlayer dielectric layer patterns as an etching mask; forming a dielectric layer on the floating gates exposed by the removal of the mold patterns between the interlayer dielectric layer patterns; forming a conductive polysilicon layer along the entire surface of the structure including the dielectric layer, but not completely filling gaps between the interlayer dielectric layer patterns; forming a metal layer on the conductive polysilicon layer, filling the gaps between the interlayer dielectric layer patterns; and forming control gates, each consisting of the conductive polysilicon layer and the metal layer, in the gaps between the interlayer dielectric layer patterns, self-aligned with the floating gates, by planarizing the metal layer and the conductive polysilicon layer to expose the top surfaces of the interlayer dielectric layer patterns.

In one embodiment, the metal layer may be formed of tungsten silicide, tungsten, or aluminum.

According to the present invention, it is possible to manufacture a non-volatile memory device including the improved profile of a gate structure and that can prevent a defect of unopened contact holes from occurring in a process for forming a contact by decreasing the height of an interlayer dielectric layer having a reduced height.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
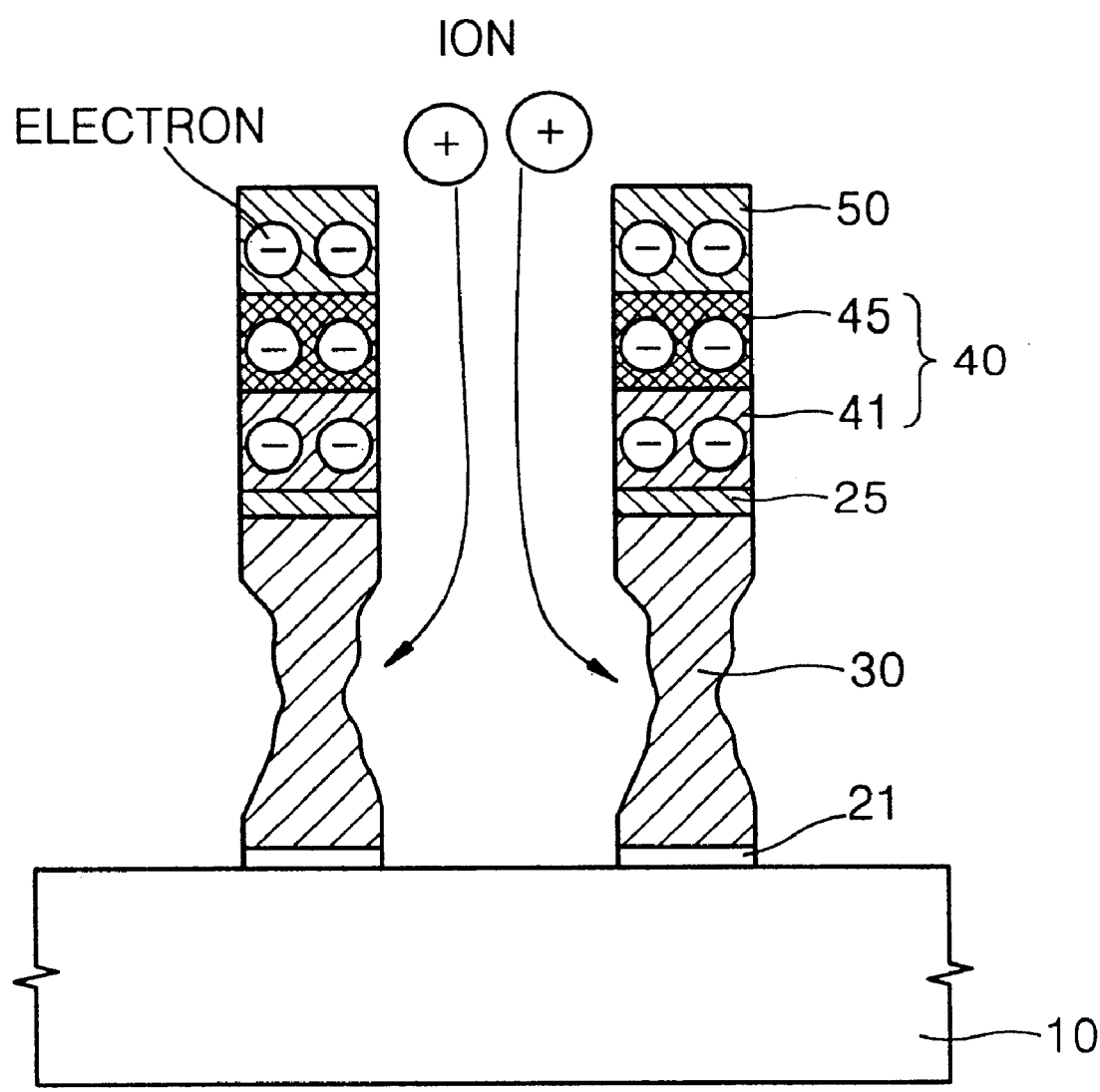
FIG. 1 is a diagram illustrating an undercut generation model in a conventional etching process for forming a gate structure of a non-volatile memory device.

The present invention will now be described more fully with reference to the accompanying drawings, in which preferred embodiments of the invention are shown. This invention may, however, be embodied in many different forms and should not be construed as being limited to the embodiments set forth herein. In the drawings, the thicknesses of layers and regions are exaggerated for clarity. It will also be understood that when a layer is referred to as being "on" another layer or substrate, it can be directly on the other layer or substrate, or intervening layers may also be present.

In the embodiments of the present invention, a new method for self-aligning a floating gate and a control gate of a non-volatile memory device will be disclosed. In this method, the control gate is formed by an improved damascene process to be naturally self-aligned with the floating gate. In addition, in the embodiments of the present invention, a non-volatile memory device, in which the height of an interlayer dielectric layer for insulating a gate structure is decreased as much as the height of a control gate will be provided.

Figure 3A:
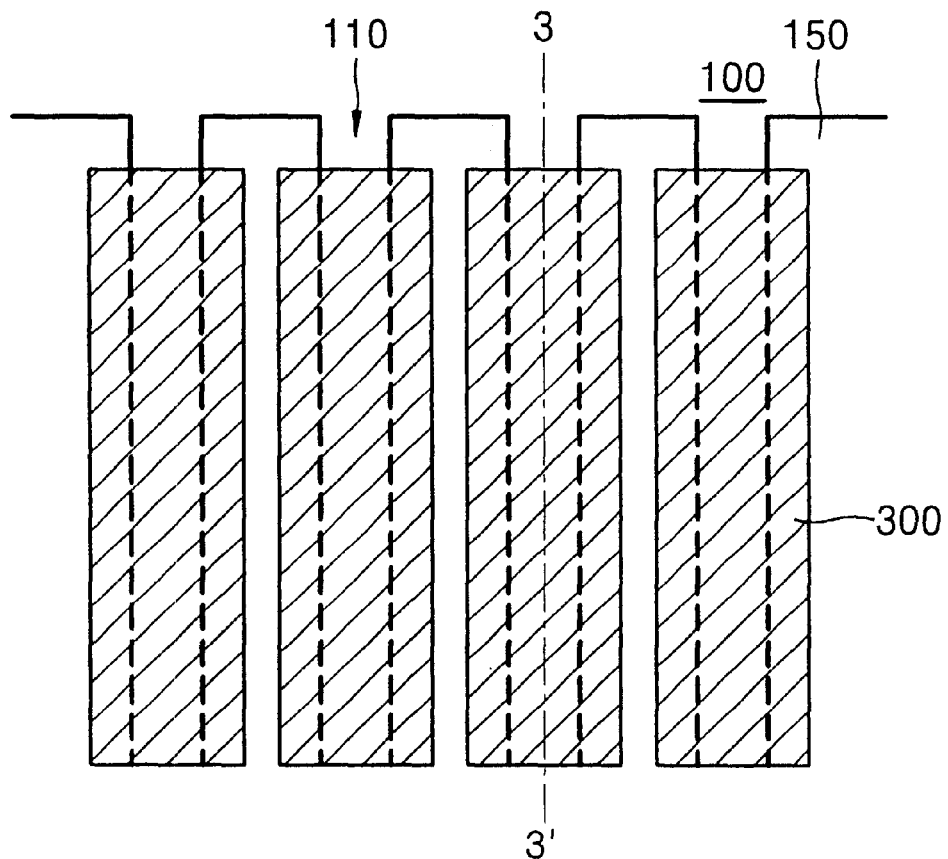
FIGS. 3A through 12 are diagrams illustrating a method for manufacturing a non-volatile memory device having a self-aligned gate structure according to preferred embodiments of the present invention.

FIGS. 3A through 8B are cross-sectional views illustrating a method for manufacturing a non-volatile memory device having a self-aligned gate structure according to a first embodiment of the present invention. Specifically, FIG. 3A is a plan view illustrating a step of forming first floating gate patterns 300. FIG. 3B is a cross-sectional view illustrating the step of forming the first floating gate patterns 300, taken along line 3–3' of FIG. 3A.

Figure 3B:
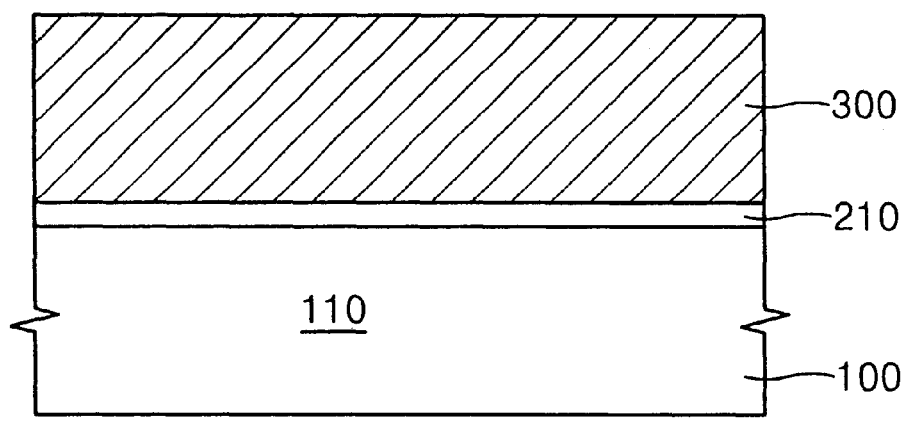

Referring to FIGS. 3A and 3B, field regions 150 are formed to define active regions 110 on a semiconductor substrate 100. The field regions 150 may be formed by various isolation methods such that regions between the field regions 150 are set as the active regions 110. Each of the field regions 150 may be formed in a line shape, extending in a particular direction.

A tunnel dielectric layer 210 is formed on the semiconductor substrate 100, on which the field regions 150 and the active regions 110 defined by the field regions 150 are formed. The tunnel dielectric layer 210 may be formed of a silicon oxide layer. Since the field regions 150 are formed of a silicon oxide layer by an isolation method, the tunnel dielectric layer 210 is thinly formed only to cover the active regions 110. A conductive layer used to form a floating gate is formed on the semiconductor substrate 100 including the tunnel dielectric layer 210. The conductive layer may be formed by depositing a conductive polysilicon layer. The conductive layer may be formed to a thickness as much as the desired thickness of the floating gate. For example, in the case of a 0.19 $\mu$m-level NAND type product, the conductive layer may be formed to a thickness of about 2000 Å.

The first conductive layer is patterned, thereby forming the first floating gate patterns 300. The first floating gate patterns 300 may be formed by a photolithographic process using a photoresist pattern as an etching mask. Each of the first floating gate patterns 300, as shown in FIG. 3A, is patterned into a line shape, extending in the direction along which the field regions 150 extend. Preferably, the first floating gate patterns 300 are formed so that the sides of each of the first floating gate patterns 300 partially overlap the field regions 150. That is, the first floating gate patterns 300 are formed to cover the active regions between the field regions 150, and substantially expose the field regions 150.

Figure 4A:
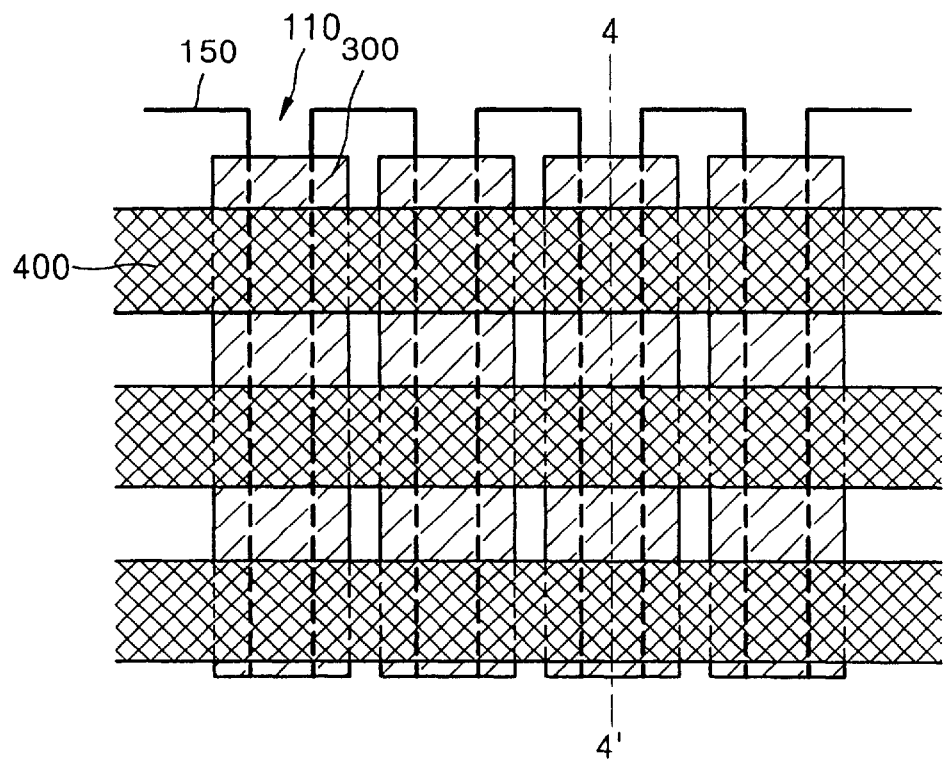
Figure 4B:
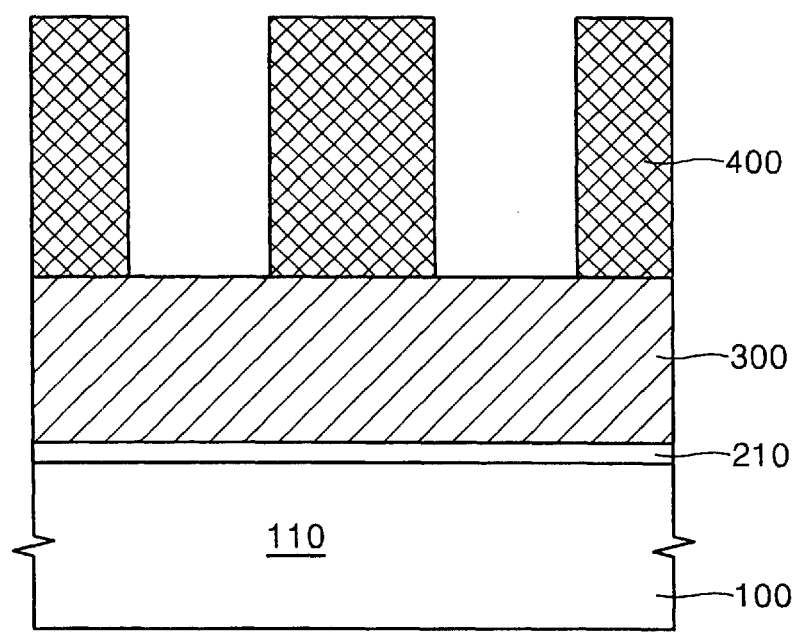

FIG. 4A is a plan view illustrating a step of forming mold patterns 400. FIG. 4B is a cross-sectional view illustrating the step of forming the mold patterns 400, taken along line 4–4' of FIG. 4A. Referring to FIGS. 4A and 4B, the mold patterns 400 are formed on the first floating gate patterns 300. The mold patterns 400 are formed to occupy regions at which control gates will be positioned. Specifically, a material layer is deposited to cover the first floating gate patterns 300 and is patterned to selectively expose predetermined portions of the surface of each of the first floating gate patterns 300.

The mold patterns 400 are prepared for a patterning process for forming interlayer dielectric layer patterns. Finally, the mold patterns 400 will be used to form control gates which are self-aligned with floating gates, by a damascene process using the interlayer dielectric layer patterns. The mold patterns 400 act as a sacrificial layer which is used to pattern an interlayer insulating layer and is then removed. In order to effectively remove only the mold patterns 400 after formation of the interlayer dielectric layer, the mold patterns 400 are preferably formed of a material having a different etching selectivity from that of the interlayer dielectric layer. In addition, it is also preferable that the mold patterns 400 are formed of a material having an etching selectivity with respect to the active regions 110, which are formed of silicon, and the field regions 150, which are formed of silicon oxide $SiO_2$. If the mold patterns 400 are formed of a material having an etching selectivity with respect to the interlayer dielectric layer to be formed later, as well as the active regions 110 and the field regions 150, it is possible to more effectively prevent the active regions 110, the interlayer dielectric layer, and the field regions 150 from being damaged by a wet etching or dry etching process for removing the mold patterns 400.

Accordingly, the mold patterns 400 may be formed of, for example, silicon nitride ($Si_3N_4$) or silicon oxynitride (SiON). Alternatively, the mold patterns 400 may be formed of a low-k inorganic material, such as silicon oxyfluoride (SiOF), boron nitride (BN), hydrosilsesquioxane (HSQ), xerogel, or aerogel. Alternatively, the mold patterns 400 may be formed of a low-k organic material, such as parlene, polynaphtalene, amorphous carbon fluoride (a-CF), silicon oxycarbide (SiOC), methylsilsesquioxane (MSQ), black diamond, flare, polyimide, or Teflon. In the present embodiment, the mold patterns 400 are formed of silicon nitride ($Si_3N_4$).

In order to form the mold patterns 400, as described above, a material layer is deposited to cover the first floating gate patterns 300. For example, a silicon nitride layer is formed to cover the first floating gate patterns 300. Next, the surface of the material layer is planarized by etch back or chemical mechanical polishing (CMP).

Next, the material layer is patterned by photolithography to remain only in the regions at which control gates will be positioned. That is, a photoresist layer pattern (not shown) is formed on the material layer, and then the material layer is selectively etched using the photoresist layer pattern as an etching mask, thereby forming the mold patterns 400. Since the mold patterns 400 are formed in the regions at which control gates will be positioned, the photolithographic process for removing the mold patterns 400 may be performed using the same layout for forming the control gates. The photolithographic process may be a dry etching process.

The mold patterns 400, as shown in FIG. 4A, are formed to cross the first floating gate patterns 300. The mold patterns 400 are formed into line shapes extending in a direction perpendicular to the first floating gate patterns 300. The mold patterns 400 are formed to selectively expose predetermined portions of the field regions 150 among the first floating gate patterns 300.

Figure 5A:
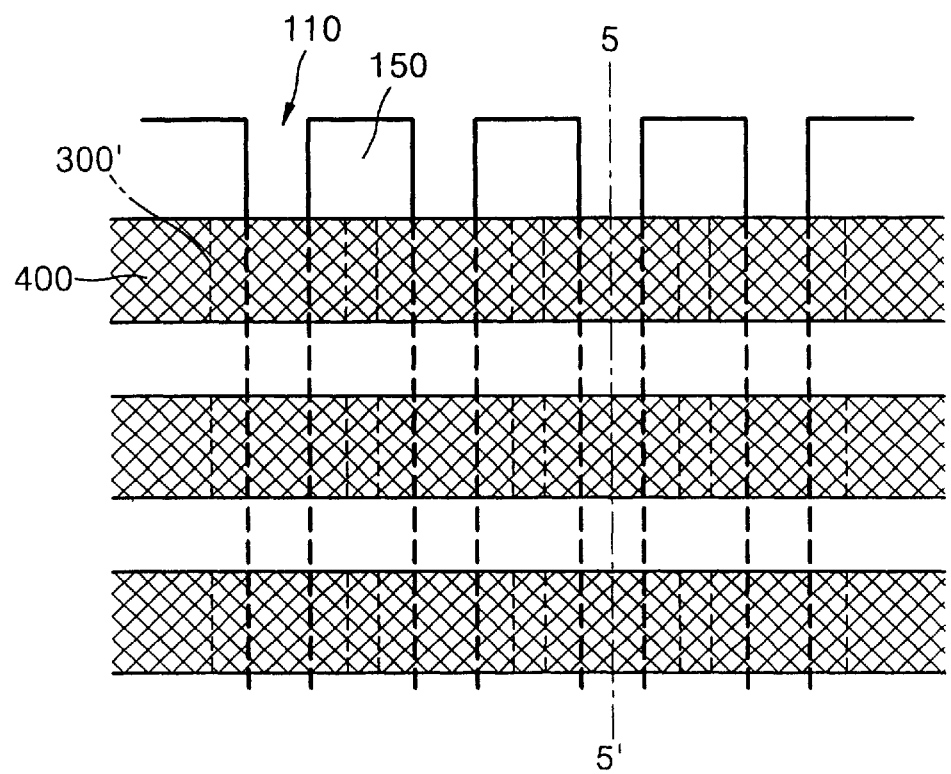
Figure 5B:
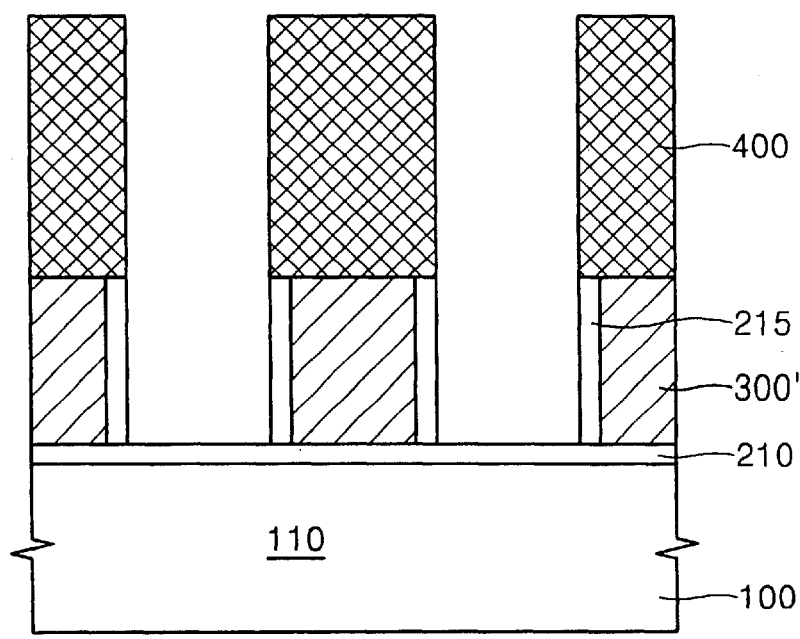

FIG. 5A is a plan view illustrating a step of forming floating gates 300' by etching the first floating gate patterns 300 of FIG. 4B exposed between the mold patterns 400. FIG. 5B is a cross-sectional view illustrating the step of forming floating gates 300', taken along line 5–5' of FIG. 5A.

Referring to FIG. 5B, the first floating gate patterns 300 of FIG. 4B exposed between the mold patterns 400 are selectively etched using the mold patterns 400 as an etching mask. As described above, since the mold patterns 400 are formed of a material having an etching selectivity with respect to the first floating gate patterns 300 that are formed of conductive polysilicon, the mold patterns 400 can be used as an etching mask. That is, as described above, the first floating gate patterns 300 may be formed of conductive polysilicon, and the mold patterns 400 may be formed of silicon nitride. Accordingly, the first floating gate patterns 300 can be etched under a condition in which polysilicon is etched faster than silicon nitride. This etching process may be a dry etching process, in which polysilicon has an etching selectivity with respect to silicon nitride.

The first floating gate patterns 300 of FIG. 4B are etched to expose the tunnel dielectric layer 210 under the first floating gate patterns 300. Accordingly, this etching process is preferably performed under a condition in which damage to the tunnel dielectric layer 210 caused by etching can be minimized. Since the first floating gate patterns 300 are formed of conductive polysilicon, they have an etching selectivity with respect to the tunnel dielectric layer 210 that is formed of silicon oxide.

As shown in FIGS. 5A and 5B, two opposing side walls of each of the floating gates 300' contact the active regions 110, and the other two opposing side walls overlap the edges of the field regions 150. Since the floating gates 300' are formed by patterning the first floating gate patterns 300 using the mold patterns 400 as an etching mask, the profiles of the two opposing sidewalls of each of the floating gates 300' contacting the active regions 110 are self-aligned with the profiles of the sidewalls of each of the mold patterns 400.

After the formation of the floating gates 300', damaged portions of the tunnel dielectric layer 210 may be cured by re-oxidization which is well known as gate poly oxidation. For example, after etching the first floating gate patterns 300 to form the floating gates 300', as described above, a cleaning process is performed. Next, the tunnel dielectric layer 210, which may be damaged by the etching or cleaning process, is cured by re-oxidization. For example, a silicon oxide layer forming the tunnel dielectric layer 210 is grown to a thickness of 30–150 Å at a temperature of about 800 –1000° C., preferably at a temperature of about 900° C. During the re-oxidization process, a silicon oxide layer 215 may be grown from the sidewalls of the floating gates 300' exposed to the re-oxidization process.

This re-oxidization process is for curing damaged portions of the tunnel dielectric layer 210; however, it affects the operational characteristics of devices, such as charge loss characteristics. Thus, it is preferable to control the degree to which the tunnel dielectric layer 210 is oxidized, in consideration of the characteristics of devices. In order to enhance the performance of devices, the re-oxidization process may be performed in a nitrogen atmosphere so that a fine amount of nitride can be added into the silicon oxide layer forming the tunnel dielectric layer 210. For example, it is possible to induce nitride of an atomic percentage of about 10% to be added into the silicon oxide layer.

Figure 6A:
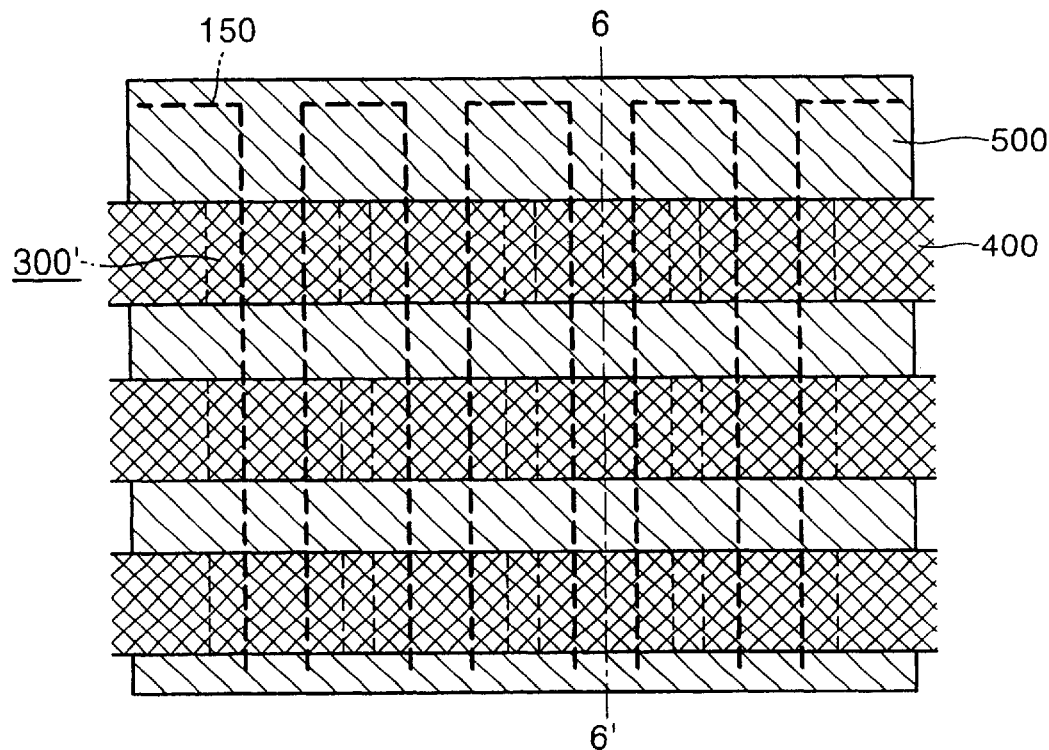
Figure 6B:
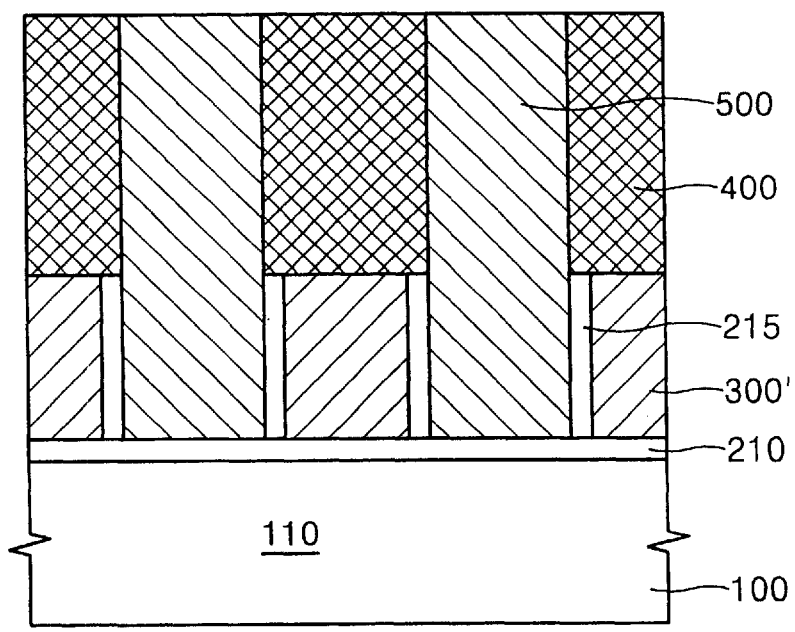

FIG. 6A is a plan view illustrating a step of forming interlayer dielectric layer patterns 500 to fill gaps between the mold patterns 400. FIG. 6B is a cross-sectional view illustrating the step of forming the interlayer dielectric layer patterns 500, taken along line 6–6' of FIG. 6A.

Referring to FIG. 6A, an interlayer dielectric layer is formed to fill gaps among the mold patterns 400. The interlayer dielectric layer will be used as a first interlayer dielectric layer (ILD-1) that is well known in non-volatile memory devices and is preferably formed of an insulating material such as silicon oxide $SiO_2$. In addition, the interlayer dielectric layer may be formed of an insulating material, such as silicon nitride ($Si_3N_4$) or silicon oxynitride (SiON), which has an etching selectivity with respect to the mold patterns 400. Alternatively, the interlayer dielectric layer may be formed of a low-k inorganic material, such as silicon oxyfluoride (SiOF), boron nitride (BN), hydrosilsesquioxane (HSQ), xerogel, or aerogel. Alternatively, the interlayer dielectric layer may be formed of a low-k organic material, such as parlene, polynaphtalene, amorphous carbon fluoride (a-CF), silicon oxycarbide (SiOC), methylsilsesquioxane (MSQ), black diamond, flare, polyimide, or Teflon. The interlayer dielectric layer is preferably formed of a material that has not been used to form the mold patterns 400, and thus has an etching selectivity with respect to the mold patterns 400.

The interlayer dielectric layer, as shown in FIGS. 5A and 5B, must be formed to cover the tunnel dielectric layer 210 exposed among the mold patterns 400 and completely fill gaps among the floating gates 300' and the gaps among the mold patterns 400.

Accordingly, the interlayer dielectric layer may be formed by a high-density plasma (HDP) method, in which deposition and etching are simultaneously performed, and layers can be deposited with superior gap filling characteristics. For example, the interlayer dielectric layer may be formed of an HDP-$SiO_2$ $SiO_2$ layer deposited by HDP. Alternatively, the interlayer dielectric layer may be formed of borophosphosilicate (BPSG) or another insulating material having superior gap filling characteristics.

The interlayer dielectric layer is preferably formed of an insulating material having an etching selectivity with respect to the mold patterns 400 such that the interlayer dielectric layer can be prevented from being damaged by a subsequent process of removing the mold patterns 400.

As described above, after the interlayer dielectric layer is deposited to sufficiently fill the gaps among the mold patterns 400, the interlayer dielectric layer is planarized to expose the top surfaces of the mold patterns 400. The interlayer dielectric layer may be planarized by CMP or etch back. As a result of planarization, as shown in FIGS. 6A and 6B, the interlayer dielectric layer patterns 500 are formed filling the gaps between the mold patterns 400. The mold patterns 400 act as a mold used to form the interlayer dielectric layer patterns 500 into a predetermined shape.

Figure 7A:
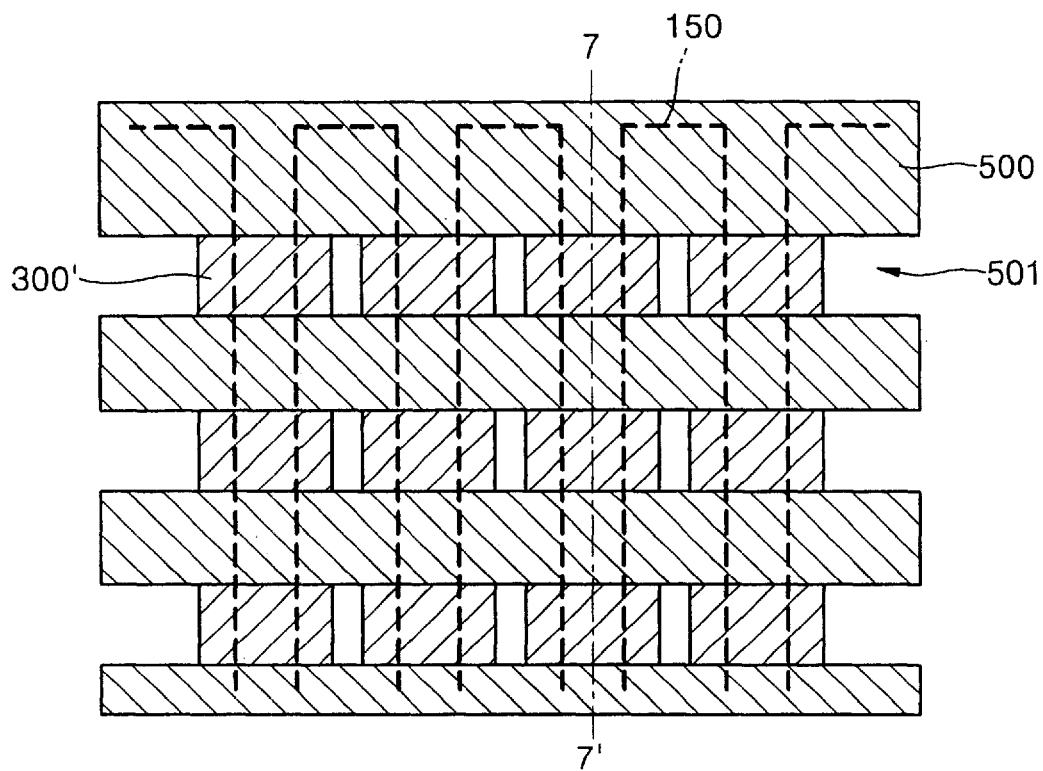
Figure 7B:
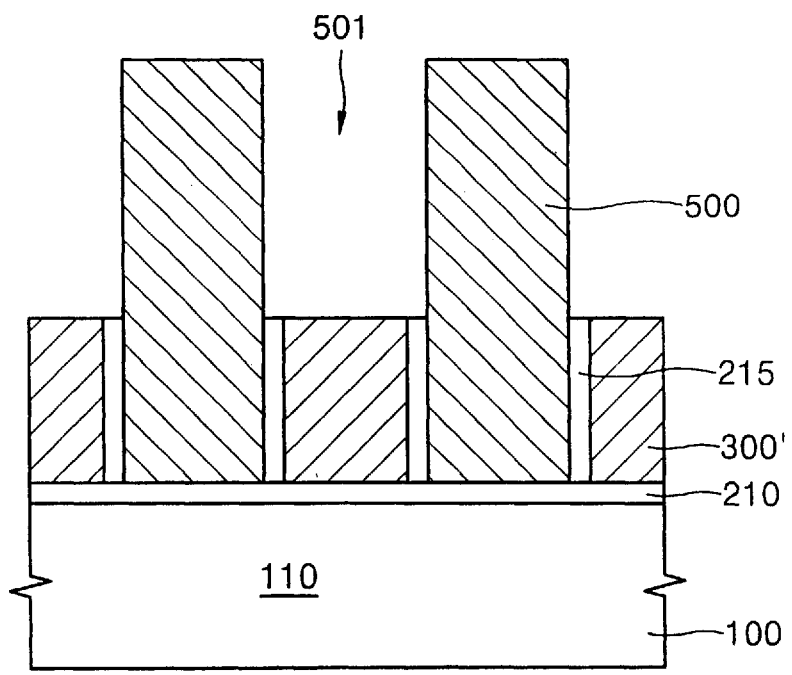

FIG. 7A is a plan view illustrating a step of selectively removing the mold patterns 400. FIG. 7B is a cross-sectional view illustrating the step of selectively removing the mold patterns 400, taken along line 7–7' of FIG. 7A.

Specifically, the mold patterns 400 are selectively removed taking advantage of the etching selectivity of the mold patterns 400 with respect to the interlayer dielectric layer patterns 500. For example, in a case where the mold patterns 400 are formed of silicon nitride $Si_3N_4$ and the interlayer dielectric layer patterns 500 are formed of silicon oxide $SiO_2$, it is possible to selectively remove the mold patterns 400 using phosphoric acid. Even in a case where the mold patterns 400 are formed of silicon oxynitride (SiON), it is also possible to selectively remove the mold patterns 400 using phosphoric acid. As described above, the mold patterns 400 are formed of a material having an etching selectivity with respect to the silicon oxide forming the interlayer dielectric layer patterns 500. Thus, even if the mold patterns 400 are formed of a material other than silicon nitride or silicon oxynitride, the mold patterns 400 are etched much faster than the interlayer dielectric layer patterns 500, and accordingly, it is possible to selectively remove the mold patterns 400. Instead of performing a wet etching method using phosphoric acid, as described above, various etching methods, such as a dry etching method or a plasma etching method, may be applied to remove the mold patterns 400, according to the materials of the mold patterns 400 and the interlayer dielectric layer patterns 500.

As a result of selectively removing the mold patterns 400, the floating gates 300' are exposed between the interlayer dielectric layer patterns 500, and the field regions 150 adjacent to the floating gates 300' may be exposed. As described above, since the mold patterns 400 are formed of a material having an etching selectivity with respect to conductive polysilicon forming the floating gates 300', the floating gates 300' can be prevented from being damaged by a selective etching process for removing the mold patterns 400. In addition, since the mold patterns 400 are formed of a material having an etching selectivity with respect to silicon oxide $SiO_2$ forming the field regions 150, the field regions 150 can also be prevented from being damaged by the selective etching process for removing the mold patterns 400.

As a result of selectively removing the mold patterns 400, as shown in FIGS. 7A and 7B, gaps 501 are formed in line shapes between the interlayer dielectric layer patterns 500. The top surfaces of the floating gates 300' and the top surfaces of the field regions 150 form the bottoms of the gaps 501, and the sidewalls of the interlayer dielectric layer patterns 500 and the sidewalls of the floating gates 300' exposed between the interlayer dielectric layer patterns 500 form the sidewalls of the gaps 501.

Figure 8A:
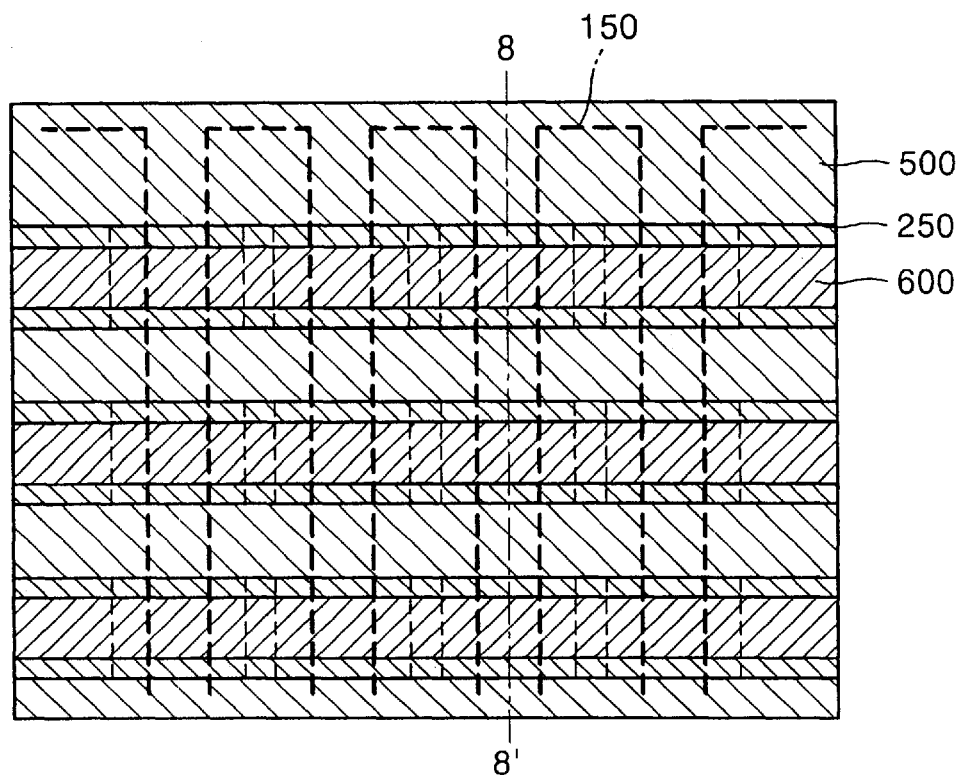
Figure 8B:
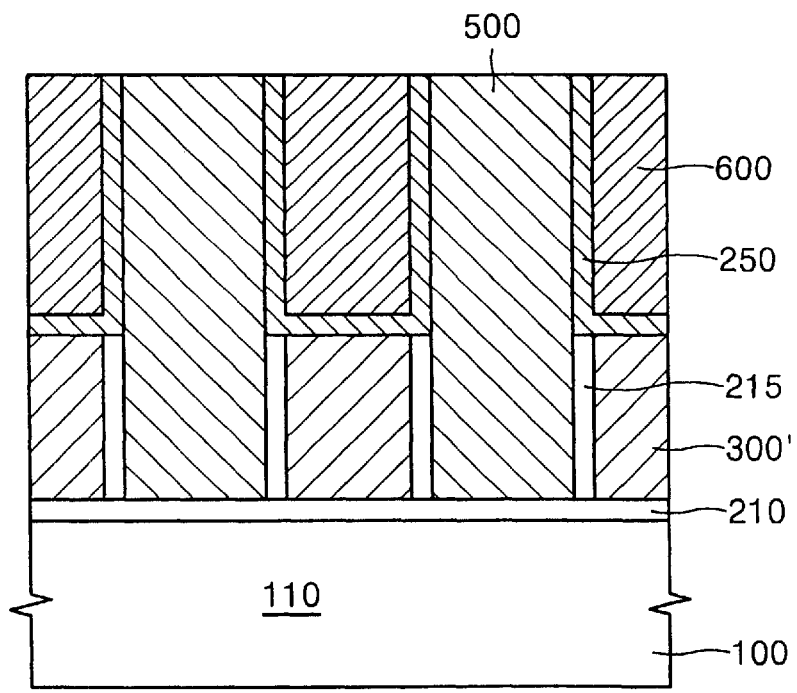

FIG. 8A is a plan view illustrating a step of forming control gates 600. FIG. 8B is a cross-sectional view illustrating the step of forming the control gates 600, taken along line 8–8' of FIG. 8A.

Specifically, a conductive layer is formed to fill the gaps 501 shown in FIGS. 7A and 7B between the interlayer dielectric layer patterns 500 of FIG. 7B. The conductive layer may be formed of conductive polysilicon. Before the deposition of the conductive layer, a dielectric layer 250 is thinly formed along the edges of the gaps 501 between the interlayer dielectric layer patterns 500. Accordingly, the dielectric layer 250 is deposited on the sidewalls and top surface of each of the floating gates 300' exposed between the interlayer dielectric patterns 500, and on the exposed sidewalls of each of the interlayer dielectric layer patterns 500.

The dielectric layer 250 may be formed of an ONO layer. Alternatively, the dielectric layer 250 may be formed of a high-k material, such as aluminum oxide ($Al_2O_3$), tantalum oxide ($Ta_2O_3$), zirconia ($ZrO_2$), hafnium oxide ($HfO_2$), titanium oxide $TiO_2$, BST(($Ba, Sr)TiO_3$), or PZT(($Pb, Zr)TiO_3$).

The high-k material may cause various problems in a conventional self-aligned gate etching process; however, in the present embodiment, the problems with the high-k material can be effectively prevented. Specifically, the high-k material, such as aluminum oxide ($Al_2O_3$) or tantalum oxide ($Ta_2O_3$), may cause metallic ions, such as $Al^+$ or $Ta^+$, to be generated in a self-aligned gate etching process, and accordingly, contamination caused by metallic ions may cause various problems in the process of manufacturing the non-volatile memory device. Thus, the use of the high-k material is restricted. In addition, it is very difficult to etch a chemically stable layer, such as an aluminum oxide ($Al_2O_3$) layer, during a self-aligned gate etching process.

However, in the present embodiment, unlike a conventional self-aligned gate etching process, the dielectric layer 250 is not etched. Thus, it is possible to effectively use the high-k material, such as aluminum oxide ($Al_2O_3$), tantalum oxide ($Ta_2O_3$), as the material of the dielectric layer 250.

Referring to FIGS. 8A and 8B, after the formation of the dielectric layer 250, a conductive layer is formed to fill the gaps 501 shown in FIGS. 7A and 7B on the dielectric layer 250. Next, the conductive layer is planarized by CMP or etch back to expose the top surfaces of the interlayer dielectric layer patterns 500, thereby forming the control gates 600 filling the gaps 501.

During planarization of the conductive layer, predetermined portions of the dielectric layer 250 covering the interlayer dielectric layer patterns 500 are removed so that the dielectric layer 250 can be naturally patterned. Accordingly, the dielectric layer 250 is positioned at the interfaces between the control gates 600 and the interlayer dielectric layer patterns 500, the interfaces between the control gates 600 and the floating gates 300', and the interfaces between the control gates 600 and the field regions 150.

Since the control gates 600 are formed in the gaps 501 shown in FIGS. 7A and 7B among the interlayer dielectric layer patterns 500, as described above, two opposing sidewalls of each of the control gates 600 are naturally aligned with the corresponding sidewalls of the floating gates 300 under that control gate, as shown in FIG. 8B. That is, the gaps 501 between the interlayer dielectric layer patterns 500 are formed by removing the mold patterns, as described above with reference to FIGS. 6A and 6B, and therefore the gaps 501 occupy spaces that have been occupied by the mold patterns 400. In addition, since the mold patterns 400 are formed to be self-aligned with the floating gates 300', as described above with reference to FIGS. 5A and 5B, the control gates 600 are naturally aligned with the floating gates 300'. Such process of forming the control gates 600 described above can be considered to be an improved damascene process.

In the present embodiment, since the floating gates 300', the dielectric layer 250, and the control gates 600 are not self-aligned by simultaneous etching, the problems with a conventional self-aligned gate etching process, including an undercut phenomenon, difficulties in etching the dielectric layer 250, and contamination caused by etching of the dielectric layer 250, can be effectively prevented.

In addition, it is possible to reduce the height of the interlayer dielectric layer patterns 500 to be the same as the height of the control gates 600. In the present embodiment, another interlayer dielectric layer (not shown) is used to cover the control gates 600; however, the present embodiment does not need a self-aligned gate etching process having a high aspect ratio, and thus formation of a hard mask, which is required in the prior art, is not necessary. Accordingly, a thinner interlayer dielectric layer can be formed to cover the control gates 600.

Up to now, the method for forming the control gates 600 according to the embodiment of the present invention has been described with reference to FIGS. 8A and 8B. However, as the integration density of non-volatile memory devices increases, the resistance of the control gates 600 must be reduced. Accordingly, various methods for reducing the resistance of the control gates 600 will be described with the embodiments of the present invention.

Figure 9:
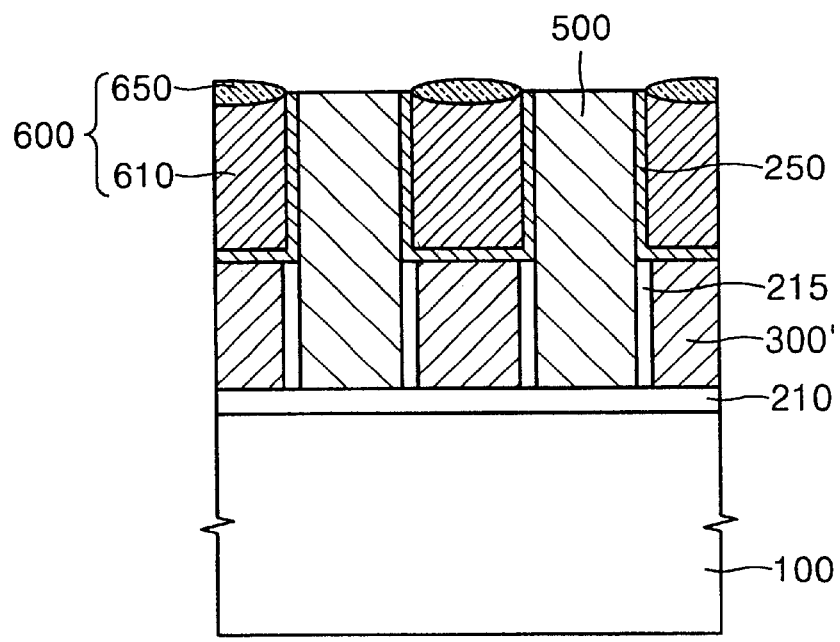

FIG. 9 is a cross-sectional view illustrating a step of forming the control gates according to a second embodiment of the present invention. In order to reduce the resistance of the control gates 600, the control gates 600 may be formed to each include a conductive polysilicon layer 610 and a metal silicide layer 650. Specifically, a conductive polysilicon layer 610 is formed to fill the gaps 510 shown in FIGS. 7A and 7B between the interlayer dielectric layer patterns 500, by the processes described above with reference to FIGS. 3A through 8B. Referring to FIG. 9, a metal layer is deposited on the conductive polysilicon layer 610, and then a silicidation process is performed on the metal layer and the conductive polysilicon layer 610 under the metal layer, thereby forming a metal silicide layer 650 at the interface between the conductive polysilicon layer and the metal layer. Next, portions of the metal layer which are not silicidated are removed, leaving the metal silicide layer 650 selectively formed on the top surface of the conductive polysilicon layer 610. The metal silicide layer 650 may be formed of titanium silicide (TiSi$_x$), cobalt silicide (CoSi$_x$), or nickel silicide (NiSi$_x$). Accordingly, it is possible to effectively reduce the resistance of the control gates 600 by selectively forming the metal silicide layer 650 on the conductive polysilicon layer 610.

Figure 10:
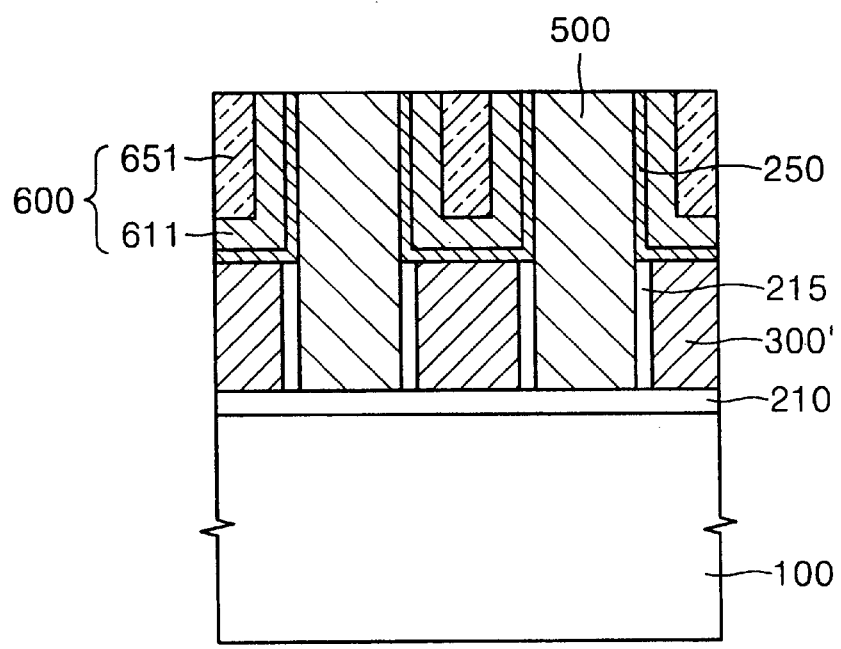

FIG. 10 is a cross-sectional view illustrating a step of forming the control gates 600 according to a third embodiment of the present invention. A method for reducing the resistance of the control gates 600 by forming a metal layer 651 on the conductive polysilicon layer 611 will be described with the third embodiment of the present invention. In the third embodiment, the conductive polysilicon layer 611 is formed to surround the sidewalls and bottom of the metal layer 651. Specifically, the interlayer dielectric layer patterns 500 are formed so that the floating gates 300' are exposed between the interlayer dielectric layer patterns 500 (or the gaps 501 are formed between the interlayer dielectric layer patterns 500 to expose the floating gates 300'), as described above with reference to FIGS. 3A through 7B. Next, the dielectric layer 250 is thinly formed, as described above with reference to FIGS. 8A and 8B. Next, as shown in FIG. 10, the conductive polysilicon layer 611 is formed on the sidewalls and bottom of each of the gaps 501, but not completely filling the gaps 501. Next, the metal layer 651 is formed on the conductive polysilicon layer 611 to completely fill the gaps 501. Next, the metal layer 651 and the conductive polysilicon layer 611 are planarized by CMP or etch back to expose the top surfaces of the interlayer dielectric layer patterns 500, thereby forming the control gates 600. The metal layer may be formed of tungsten (W), tungsten silicide WSi$_x$, or aluminum (Al).

As described above, the metal layer 651 is formed of a tungsten silicide layer, a tungsten layer, or an aluminum layer, in a line shape in the middle of each of the control gates 600, and the conductive polysilicon layer 611 is formed in each of the gaps 501 surrounding the sidewalls and bottom of the metal layer 651. Accordingly, the resistance of the control gates 600 can be effectively reduced.

It is very difficult to form the control gates 600 shown in FIG. 10 with a conventional self-aligned gate etching process. However, in the present embodiment, the control gates 600 can be readily formed as shown in FIG. 10.

Figure 11:
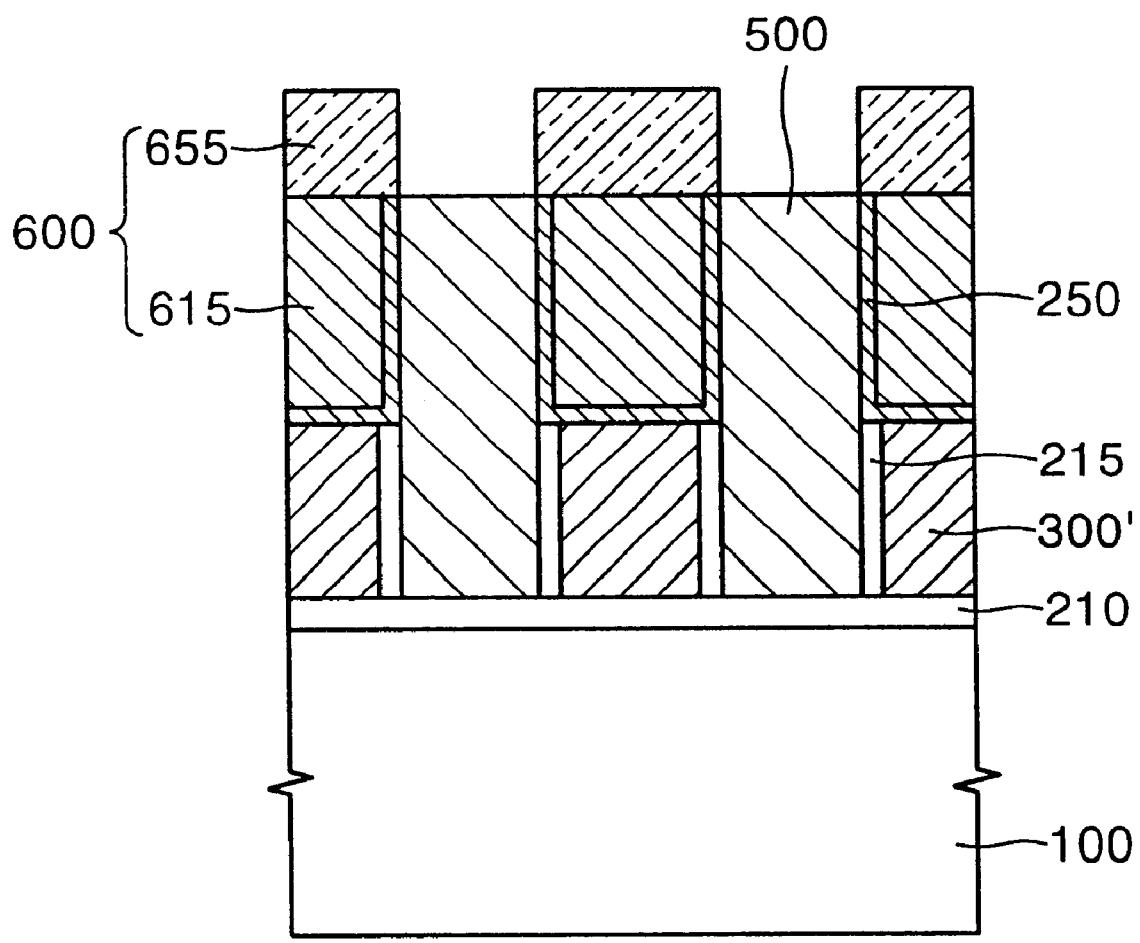

FIG. 11 is a cross-sectional view illustrating a step of forming the control gates 600 according to a fourth embodiment of the present invention. A method for reducing the resistance of the control gates 600 by a metal layer pattern 655 on a conductive polysilicon layer pattern 615 will be described with the fourth embodiment of the present invention. The dielectric layer 250 and a conductive polysilicon layer are formed to fill the gaps 501 between the interlayer dielectric layer patterns 500, as described above with reference to FIGS. 3A through 8B, and are planarized, thereby forming the conductive polysilicon layer pattern 615. Next, the metal layer pattern 655 is formed to be self-aligned with the conductive polysilicon layer pattern 615. That is, a metal layer is formed on the interlayer dielectric layer patterns 500 to cover the conductive polysilicon layer pattern 615, and is patterned by photolithography, thereby forming the metal layer pattern 655. The metal layer pattern 655 may be formed of tungsten (W), tungsten silicide (WSi$_x$), or aluminum (Al).

As described above, it is possible to reduce the height of the interlayer dielectric layer 500 to a height level of the control gates 600. Accordingly, it is possible to manufacture a good contact in the manufacture of non-volatile memory devices.

Figure 12:
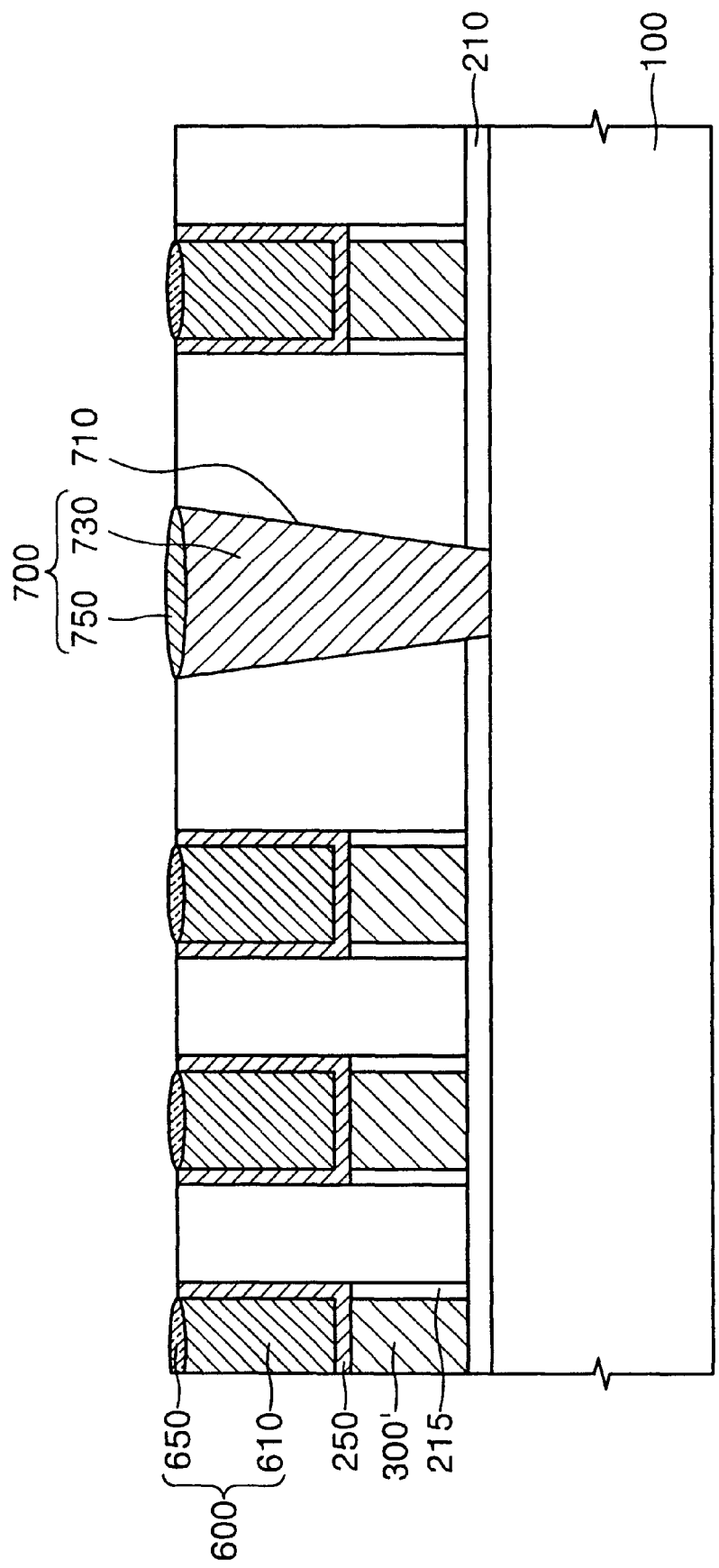

FIG. 12 is a cross-sectional view illustrating a method for manufacturing a contact as well as a gate structure according to a preferred embodiment of the present invention. Specifically, the interlayer dielectric layer patterns 500 are formed so that the gaps 501 are positioned among the interlayer dielectric layer patterns 500, and then the control gates 600 are formed to be self-aligned with the floating gates 300', as described above with reference to FIGS. 3A through 7B and 9. At the same time, a contact hole 710 is formed to expose a predetermined portion of an active region 110 of the semiconductor substrate 100 by patterning the interlayer dielectric layer patterns 500.

The patterning process for forming the contact hole 710 may be performed after forming the conductive polysilicon layer 610 of FIG. 9 to fill the gaps 501 of FIGS. 7A and 7B, as described above with reference to FIGS. 8A, 8B, and 9. For example, the conductive polysilicon layer 610 is formed and is planarized. Next, a photoresist pattern (not shown) is formed to selectively expose a predetermined portion of the interlayer dielectric layer patterns 500, and then the exposed portion of the interlayer dielectric layer patterns 500 is selectively etched using the photoresist pattern as an etching mask, thereby forming the contact hole 710 exposing a predetermined portion of an active region 110 of the semiconductor substrate 100. Next, the photoresist pattern is removed, and then a second conductive polysilicon layer is deposited to fill the contact hole 710. Next, the second conductive polysilicon layer is planarized by CMP or etch back, thereby forming a conductive polysilicon contact 730 electrically connected to the active region 110 of the semiconductor substrate 100.

Next, a metal layer is deposited on the conductive polysilicon contact 730 and the conductive polysilicon layer 610, and then a silicidation process is performed on the metal layer. Accordingly, a metal silicide contact 750 is selectively formed on the conductive polysilicon contact 730, thereby forming a conductive contact 700 including the conductive polysilicon contact 730 and the metal silicide contact 750. At the same time, the control gates 600 each including the conductive polysilicon layer 610 and the metal silicide layer 650 are formed. Next, portions of the metal layer which are not silicidated are removed. Accordingly, it is possible to form both the metal silicide contact 750 and the metal silicide layer 650 at one time by the silicidation process.

Figure 2:
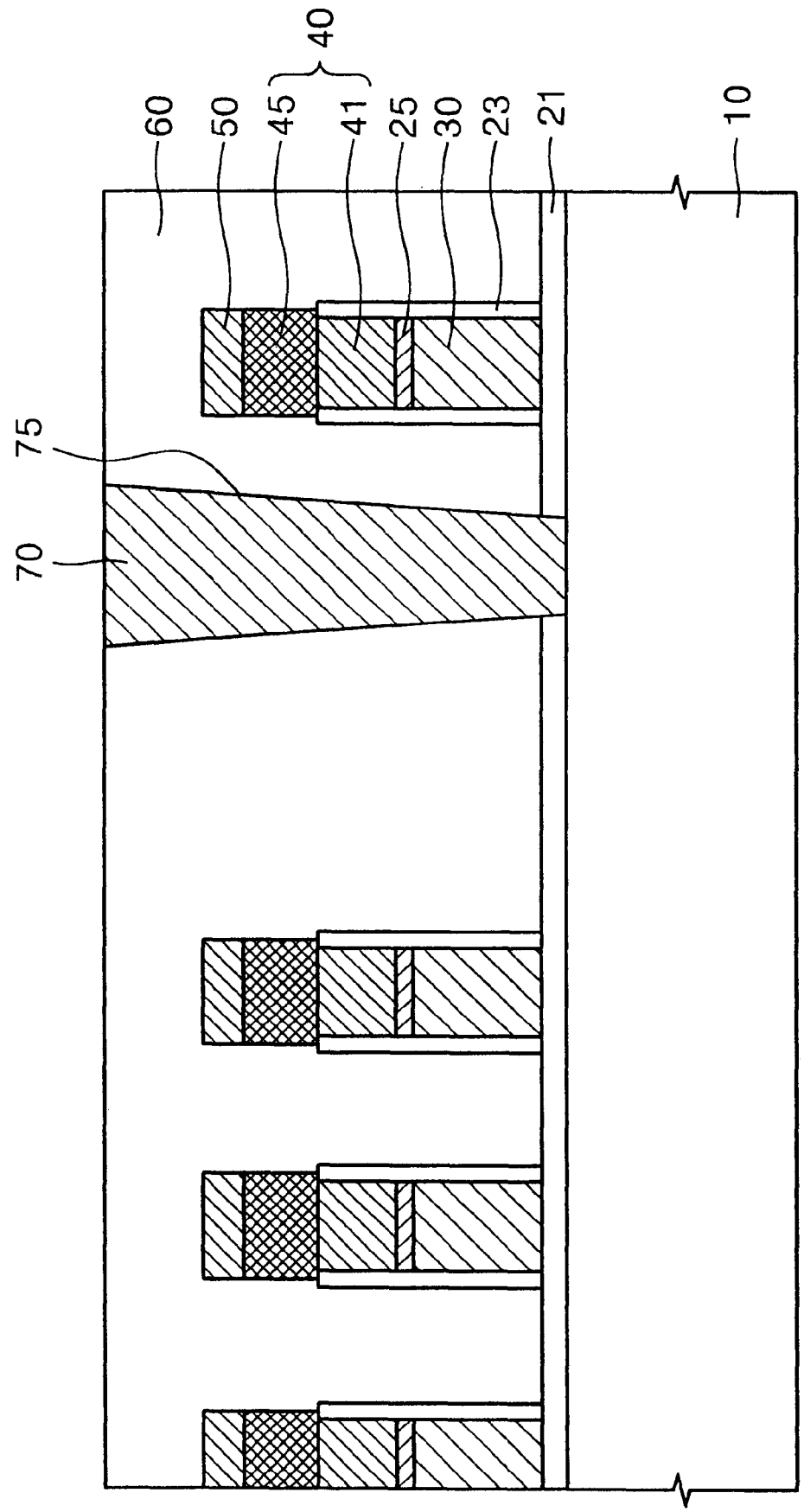
FIG. 2 is a cross-sectional view illustrating an interlayer dielectric layer covering a gate structure of a conventional non-volatile memory device.

As described above, the conductive contact 700 can be used as a common source line (CSL) in a non-volatile memory device. The depth of the contact hole 710 used to form the conductive contact 700 may be smaller than the depth of the contact hole 75 shown in FIG. 2. Accordingly, the aspect ratio of the contact hole 710 may be less than the aspect ratio of the contact hole 75 of the prior art, and thus defects that may occur during an etching process for forming the contact hole 710 can be prevented. For example, an unopened contact hole can be prevented.

In addition, as described above, since the conductive contact 700 is formed including the conductive polysilicon contact 730 and the metal silicide contact 750, the resistance of the conductive contact 700 can be effectively reduced. That is, since the metal silicide contact 750, like the metal silicide layer 650, may be formed of titanium silicide (TiSi$_x$), cobalt silicide (CoSi$_x$), or nickel silicide (NiSi$_x$), the resistance of the conductive contact 700 can be reduced.

In the present embodiment, the step of forming the contact hole 710 is described as being performed after the planarization of the conductive polysilicon layer 610 included in each of the control gates 600; however, it may be performed at any time before silicidation. For example, before the formation of the conductive polysilicon layer 610, the step of forming the contact hole 710 by photolithography may be performed. If so, the conductive polysilicon contact 730 used to form the conductive contact 700 may be formed with the conductive polysilicon layer 610 in the deposition and planarization for the conductive polysilicon layer 610, in which case the dielectric layer 250 may be deposited before the formation of the contact hole 710.

As described above, since it is possible to reduce the height of the interlayer dielectric layer 500, it becomes more convenient to form the conductive contact 700, which is used as a CSL, a direct contact, and a metal contact.

According to the present invention, a floating gate, a dielectric layer, and a control gate are not self-aligned by simultaneous etching, when patterning a gate structure of a non-volatile memory device, and it is possible to pattern the control gate to be self-aligned with the floating gate. Accordingly, profile defects, such as undercut, which may occur in a conventional self-aligned gate etching process, can be prevented. In addition, a hard mask, as required in the prior art, is not necessary. Thus, the height of an interlayer dielectric layer can be substantially reduced, and unopened contact holes forming a contact of a CSL can be prevented. Moreover, it is possible to use a silicide layer to form the contact of a CSL, and thus the resistance of the contact can be effectively reduced.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for manufacturing a non-volatile memory device comprising:

forming a tunnel dielectric layer on a semiconductor substrate;

forming first floating gate patterns on the tunnel dielectric layer;

forming mold patterns on the first floating gate patterns to selectively expose predetermined portions of the first floating gate patterns;

forming floating gates by removing the exposed portions of the first floating gate patterns using the mold patterns as a mask;

forming interlayer dielectric layer patterns for insulating the floating gates from one another by filling gaps between the mold patterns;

removing the mold patterns exposed between the interlayer dielectric layer patterns using the interlayer dielectric layer patterns as an etching mask;

forming a dielectric layer on the floating gates exposed by the removal of the mold patterns between the interlayer dielectric layer patterns; and forming control gates aligned with the floating gates by filling gaps between the interlayer dielectric layer patterns on the dielectric layer.

2. The method of claim 1, wherein forming the mold patterns comprises:

forming a material layer covering the first floating gate patterns;

planarizing the material layer; and patterning the planarized material layer by photolithography, selectively leaving portions of the material layer that occupy spaces in which the control gates will be formed.

3. The method of claim 1, wherein the mold patterns are formed of a material having an etching selectivity with respect to the floating gates.

4. The method of claim 1, wherein the mold patterns are formed of a material having an etching selectivity with respect to the interlayer dielectric layer patterns.

5. The method of claim 1, wherein the mold patterns are formed of a material having an etching selectivity with respect to the semiconductor substrate.

6. The method of claim 1, wherein the mold patterns are formed of at least one of silicon nitride ($Si_3N_4$), silicon oxynitride (SiON), silicon oxyfluoride (SiOF), boron nitride (BN), hydrosilsesquioxane (HSQ), xerogel, aerogel, parlene, polynaphtalene, amorphous-carbon fluoride (a-CF), silicon oxycarbide (SiOC), methylsilses quioxane (MSQ), black diamond, flare, polyimide, and Teflon.

7. The method of claim 1, wherein the floating gates are formed of conductive polysilicon.

8. The method of claim 1, further comprising curing the tunnel dielectric layer in the event the tunnel dielectric layer was damaged in the formation of the floating gates.

9. The method of claim 8, wherein the tunnel dielectric layer is cured by a re-oxidization process of growing a silicon oxide layer to a thickness of about 30–150 Å at a high temperature of about 800–1000° C.

10. The method of claim 1, wherein the interlayer dielectric layer patterns are formed of a different material from that of the mold patterns.

11. The method of claim 10, wherein the interlayer dielectric layer patterns are formed of at least one of silicon oxide ($SiO_2$), silicon nitride ($Si_3N_4$), silicon oxynitride (SiON), silicon oxyfluoride (SiOF), boron nitride (BN), hydrosilsesquioxane (HSQ), xerogel, aerogel, parlene, polynaphtalene, amorphous-carbon fluoride (a-CF), silicon oxycarbide (SiOC), methylsilses quioxane (MSQ), black diamond, flare, polyimide, and Teflon.

12. The method of claim 1, wherein forming the interlayer dielectric layer patterns comprises:

forming an interlayer dielectric layer pattern on the mold patterns to fill the gaps between the mold patterns; and planarizing the interlayer dielectric layer to expose the top surfaces of the mold patterns.

13. The method of claim 1, wherein the dielectric layer is formed of at least one of oxide/nitride/oxide (ONO), aluminum oxide ($Al_2O_3$), tantalum oxide ($Ta2O_3$), zirconia ($ZrO_2$), hafnium oxide ($HfO_2$), titanium oxide ($TiO_2$), BST ($(Ba, Sr)TiO_3$), and PZT($(Pb, Zr)TiO_3$).

14. The method of claim 1, wherein forming the control gates comprises:

forming a conductive layer on the dielectric layer to fill the gaps between the interlayer dielectric layer patterns; and planarizing the conductive layer to expose the top surfaces of the interlayer dielectric layer patterns.

15. The method of claim 14, wherein the conductive layer is planarized by at least one of chemical mechanical polishing (CMP) and etch back.

16. The method of claim 14, wherein the conductive layer is planarized so that, the dielectric layer is patterned to be left only in the gaps between the interlayer dielectric layer patterns.

17. The method of claim 1, wherein the control gates are formed of conductive polysilicon.

18. The method of claim 17, further comprising forming a metal silicide layer on the top surface of each of the control gates by silicidating the conductive polysilicon.

19. The method of claim 18, wherein the metal silicide layer is formed of at least one of silicide, titanium silicide, and nickel silicide.

20. The method of claim 1, further comprising forming metal layer patterns on the control gates, aligned with the control gates.

21. The method of claim 20, wherein the metal layer patterns are formed of at least one of tungsten silicide, tungsten, and aluminum.

22. The method of claim 1, further comprising:
forming a contact hole through the interlayer dielectric layer patterns to expose a predetermined portion of the semiconductor substrate; and
forming a conductive contact that is substantially level with the control gates by filling the contact hole.

23. The method of claim 1, further comprising a metal silicide layer on the top surface of the conductive contact.

24. A method for manufacturing a non-volatile memory device comprising:
forming field regions extending in one direction on a semiconductor substrate to define active regions;
forming a tunnel dielectric layer on the active regions;
forming first floating gate patterns extending in the direction of the length of the field regions;
forming mold patterns on the first floating gate patterns crossing the first floating gate patterns and selectively exposing predetermined portions of the first floating gate patterns;
forming floating gates by removing the exposed portions of the first floating gate patterns using the mold patterns as a mask;
forming interlayer dielectric layer patterns for insulating the floating gates from one another by filling gaps between the mold patterns;
removing the mold patterns exposed between the interlayer dielectric layer patterns using the interlayer dielectric layer patterns as an etching mask;
forming a dielectric layer on the floating gates exposed by the removal of the mold patterns between the interlayer dielectric layer patterns; and
forming control gates aligned with the floating gates and crossing the field region.

25. A method for manufacturing a non-volatile memory device comprising:
forming field regions extending in one direction on a semiconductor substrate to define active regions;
forming a tunnel dielectric layer on the active regions;
forming first floating gate patterns covering the tunnel dielectric layer and extending in the direction of the length of the field regions;
forming mold patterns on the first floating gate patterns crossing the first floating gate patterns and selectively exposing predetermined portions of the first floating gate patterns;
forming floating gates by removing the exposed portions of the first floating gate patterns using the mold patterns as a mask;
forming interlayer dielectric layer patterns for insulating the floating gates from one another by filling gaps between the mold patterns;
removing the mold patterns exposed between the interlayer dielectric layer patterns using the interlayer dielectric layer patterns as an etching mask;
forming a dielectric layer on the floating gates exposed by the removal of the mold patterns between the interlayer dielectric layer patterns;
forming a conductive polysilicon layer along the entire surface of the structure including the dielectric layer, but not completely filling gaps between the interlayer dielectric layer patterns;
forming a metal layer on the conductive polysilicon layer, filling the gaps between the interlayer dielectric layer patterns; and
forming control gates, each consisting of the conductive polysilicon layer and the metal layer, in the gaps between the interlayer dielectric layer patterns, self-aligned with the floating gates, by planarizing the metal layer and the conductive polysilicon layer to expose the top surfaces of the interlayer dielectric layer patterns.

26. The method of claim 25, wherein the mold patterns are formed of a different material from that of the interlayer dielectric layer patterns.

27. The method of claim 25, wherein the metal layer is formed of at least one of tungsten silicide, tungsten, and aluminum.

28. A method for manufacturing a non-volatile memory device comprising:
forming a tunnel dielectric layer on a semiconductor substrate;
forming first floating gate patterns on the tunnel dielectric layer;
forming mold patterns on the first floating gate patterns to selectively expose predetermined portions of the first floating gate patterns;
forming floating gates by removing the exposed portions of the first floating gate patterns using the mold patterns as a mask;
forming interlayer dielectric layer patterns for insulating the floating gates from one another by filling gaps between the mold patterns;
removing the mold patterns exposed between the interlayer dielectric layer patterns using the interlayer dielectric layer patterns as an etching mask;
forming a dielectric layer on the floating gates exposed by the removal of the mold patterns between the interlayer dielectric layer patterns;
forming a conductive polysilicon layer pattern in the gaps between the interlayer dielectric layer patterns on the dielectric layer; and
forming control gates, each consisting of the conductive polysilicon pattern and a metal layer pattern, aligned with the floating gates, by forming the metal layer pattern to be aligned with the conductive layer pattern.

29. The method of claim 28, wherein the mold patterns are formed of a different material from that of the interlayer dielectric layer patterns.

30. The method of claim 28, wherein the metal patterns are formed of at least one of tungsten silicide, tungsten, and aluminum.

31. A method for manufacturing a non-volatile memory device comprising:
forming a tunnel dielectric layer on a semiconductor substrate;
forming first floating gate patterns on the tunnel dielectric layer;
forming mold patterns on the first floating gate patterns to selectively expose predetermined portions of the first floating gate patterns;

forming floating gates by removing the exposed portions of the first floating gate patterns using the mold patterns as a mask;

forming interlayer dielectric layer patterns for insulating the floating gates from one another by filling gaps between the mold patterns;

removing the mold patterns exposed between the interlayer dielectric layer patterns using the interlayer dielectric layer patterns as an etching mask;

forming a dielectric layer on the floating gates exposed by the removal of the mold patterns between the interlayer dielectric layer patterns;

forming a conductive polysilicon layer pattern in the gaps between the interlayer dielectric layer patterns on the dielectric layer; and forming control gates, each consisting of the conductive polysilicon layer pattern and a metal silicide layer, aligned with the floating gates, by forming the metal silicide layer on the top surface of the conductive polysilicon layer pattern.

32. The method of claim 31, wherein the mold patterns are formed of a different material from that of the interlayer dielectric layer patterns.

33. The method of claim 31, wherein forming the metal silicide layer comprises:

forming a metal layer on the conductive polysilicon layer pattern;

selectively forming a metal silicide layer at the interface between the polysilicon layer pattern and the metal layer by silicidating the metal layer; and selectively removing portions of the metal layer which are not silicidated.

34. The method of claim 31, wherein the metal suicide layer is formed of at least one of cobalt silicide, titanium silicide, and nickel silicide.

35. A method for manufacturing a non-volatile memory device comprising:

forming a tunnel dielectric layer on a semiconductor substrate;

forming first floating gate patterns on the tunnel dielectric layer;

forming mold patterns on the first floating gate patterns to selectively expose predetermined portions of the first floating gate patterns;

forming floating gates by removing the exposed portions of the floating gates using the mold patterns as a mask;

forming interlayer dielectric layer patterns for insulating the floating gates from one another by filling gaps between the mold patterns;

removing the mold patterns exposed between the interlayer dielectric layer patterns using the interlayer dielectric layer patterns as an etching mask;

forming a dielectric layer on the floating gates exposed by the removal of the mold patterns between the interlayer dielectric layer patterns;

forming a conductive polysilicon layer pattern in the gaps between the interlayer dielectric layer patterns on the dielectric layer;

forming control gates, each consisting of the conductive polysilicon layer pattern and a metal silicide layer, aligned with the floating gates, by forming the metal silicide layer on the top surface of the conductive polysilicon layer pattern;

forming a contact hole to expose a predetermined portion of the semiconductor substrate by selectively etching the interlayer dielectric layer patterns;

forming a conductive polysilicon contact filling the contact hole; and forming a metal silicide contact on the top surface of the conductive polysilicon contact by silicidating the top portion of the conductive polysilicon contact when forming the metal silicide layer.

36. The method of claim 35, wherein the contact hole is formed by patterning the interlayer dielectric layer patterns using photolithography, after the formation of the conductive polysilicon layer pattern, in the gaps between the interlayer dielectric layer patterns.

37. The method of claim 36, wherein forming the conductive polysilicon contact comprises:

depositing a conductive polysilicon layer on the interlayer dielectric layer patterns to fill the contact hole; and planarizing the conductive polysilicon layer to expose the top surfaces of the interlayer dielectric layer patterns.

38. The method of claim 37, wherein the conductive polysilicon layer is planarized by at least one of CMP and etch back.

39. The method of claim 35, wherein the metal silicide contact is formed of at least one of cobalt silicide, titanium silicide, and nickel silicide.

* * * * *

UNITED STATES PATENT AND TRADEMARK OFFICE
CERTIFICATE OF CORRECTION

PATENT NO. : 6,642,107 B2 Page 1 of 1
DATED : November 4, 2003
INVENTOR(S) : Kang-ill Seo, Jae-seung Hwang and Seung-min Lee It is certified that error appears in the above-identified patent and that said Letters Patent is hereby corrected as shown below:

<u>Column 14,</u>
Line 28, please replace "30-150A" with -- 30-150 D --
Line 29, please replace "800-1000 C" with -- 800-1000 EC --
Line 63, please delete "," after "that"

Signed and Sealed this

Second Day of March, 2004

JON W. DUDAS
*Acting Director of the United States Patent and Trademark Office*